(12) United States Patent
Ootsuka

(10) Patent No.: US 11,224,139 B2
(45) Date of Patent: Jan. 11, 2022

(54) CIRCUIT BOARD FALL-OUT PREVENTION STRUCTURE AND NUMERICAL CONTROL DEVICE

(71) Applicant: FANUC CORPORATION, Yamanashi (JP)

(72) Inventor: Yuuma Ootsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/823,285

(22) Filed: Mar. 18, 2020

(65) Prior Publication Data

US 2020/0305299 A1 Sep. 24, 2020

(30) Foreign Application Priority Data

Mar. 22, 2019 (JP) .............................. JP2019-055553

(51) Int. Cl.
*H05K 7/14* (2006.01)
*H05K 5/00* (2006.01)

(52) U.S. Cl.
CPC ......... *H05K 7/1409* (2013.01); *H05K 5/0017* (2013.01); *H05K 7/1427* (2013.01)

(58) Field of Classification Search
CPC .. H05K 7/1409; H05K 5/0017; H05K 7/1427; H05K 7/1402; H01R 12/7005; H01R 13/62933
See application file for complete search history.

(56) References Cited

U.S. PATENT DOCUMENTS

| 4,301,494 A * | 11/1981 | Jordan ................. H05K 7/1409 361/725 |
| 4,614,389 A | 9/1986 | Albert et al. |
| 5,340,340 A * | 8/1994 | Hastings ................. G06F 1/181 312/223.1 |
| 7,679,933 B2 * | 3/2010 | Makabe ................. G06F 1/185 361/801 |

FOREIGN PATENT DOCUMENTS

| JP | H38491 U | 1/1991 |
| JP | H4-70783 U | 6/1992 |
| JP | H1013062 A | 1/1998 |
| JP | 200243776 A | 2/2002 |
| JP | 200728796 A | 2/2007 |
| JP | 2012-99678 A | 5/2012 |

* cited by examiner

*Primary Examiner* — James Wu
(74) *Attorney, Agent, or Firm* — Hauptman Ham, LLP

(57) ABSTRACT

A circuit board fall-out prevention structure includes: a housing; a circuit board fitted to the housing in an insertable and extractable manner; an insertion and extraction lever supported with a shaft rotatably with respect to the circuit board and capable of being hooked on the housing to facilitate an insertion and extraction operation of the circuit board; and a recess-protrusion capable of being hooked between the insertion and extraction lever and the circuit board after insertion of the circuit board in a direction different from an insertion and extraction direction of the circuit board.

5 Claims, 4 Drawing Sheets

CIRCUIT BOARD FALL-OUT PREVENTION STRUCTURE AND NUMERICAL CONTROL DEVICE

RELATED APPLICATIONS

The present application claims priority to Japanese Application Number 2019-055553, filed Mar. 22, 2019, the disclosure of which is hereby incorporated by reference herein in its entirety.

BACKGROUND OF THE INVENTION

1. Field of the Invention

The present invention relates to a circuit board insertion and extraction technique, and particularly relates to a circuit board fall-out prevention structure and a numerical control device.

2. Description of the Related Art

In order to perform insertion and extraction of a circuit board to a housing with ease, an insertion and extraction lever is attached to a circuit board or an interface plate of a circuit board in some cases. The insertion and extraction lever uses the principle of leverage, and makes it possible to perform a circuit board insertion and extraction operation using relatively small force by being hooked on a groove portion or the like of the housing. FIGS. 7A to 7C illustrate an example of a related insertion and extraction lever. As illustrated in FIG. 7A, an insertion and extraction lever 70 is supported with a shaft rotatably with respect to a circuit board 71. The insertion and extraction lever 70 includes an insertion hook piece 73 that is hooked on a groove portion 76 of a housing 72, an extraction hook piece 74 that is hooked on an end portion 77 of the housing 72, and an operation piece 75 used for an insertion and extraction operation of the circuit board 71.

When the circuit board 71 is inserted, by raising the insertion and extraction lever 70 once as illustrated in FIG. 7B, hooking the insertion hook piece 73 on the groove portion 76 of the housing 72, and pushing-in the operation piece 75, the circuit board 71 is inserted into a connection connector (not illustrated) within the housing 72. After the insertion of the circuit board 71, the insertion and extraction lever 70 becomes in a lying state as illustrated in FIG. 7C. When the circuit board 71 is extracted, by raising the insertion and extraction lever 70 as illustrated in FIG. 7B, hooking the extraction hook piece 74 on the end portion 77 of the housing 72, and pulling up the operation piece 75, the circuit board 71 is extracted from the connection connector (not illustrated) within the housing 72.

As such a circuit board insertion and extraction technique, the following documents are known, for example. JP 2012-99678 A discloses that, in order to prevent a printed circuit board from being vigorously inserted into a housing, a lever is locked in a first orientation when the printed circuit board is inserted into the housing.

JP H04-70783 U1 discloses that, in order to prevent an electronic circuit board from falling out, an attachment and detachment lever includes a first attachment and detachment lever body that is supported with a shaft so as to be freely rotated along a surface of the electronic circuit board, and a second attachment and detachment lever that is supported with a shaft by the first attachment and detachment lever body rotatably along a surface orthogonal to a rotational surface of the first attachment and detachment lever body and is engaged to a groove portion formed in a shelf by being rotated after insertion of the electronic circuit board.

SUMMARY OF THE INVENTION

Since the insertion and extraction lever is not used to lock the circuit board within the housing, in a device in which vibration, shock, or the like is transmitted, for example, a numerical control device or the like that controls a machine tool, the circuit board comes off from the housing in some cases. Furthermore, due to a cable or the like connected to the circuit board being unintentionally pulled, the insertion and extraction lever may be easily released and the circuit board may fall out from the housing.

Accordingly, it has been desired to implement a technique of preventing a circuit board from falling out in a simple operation without increasing the number of parts.

One aspect of the present disclosure provides a circuit board fall-out prevention structure including: a housing; a circuit board fitted to the housing in an insertable and extractable manner; an insertion and extraction lever supported with a shaft rotatably with respect to the circuit board and capable of being hooked on the housing to facilitate an insertion and extraction operation of the circuit board; and a recess-protrusion capable of being hooked between the insertion and extraction lever and the circuit board after insertion of the circuit board in a direction different from an insertion and extraction direction of the circuit board.

DETAILED DESCRIPTION

Figure 1:
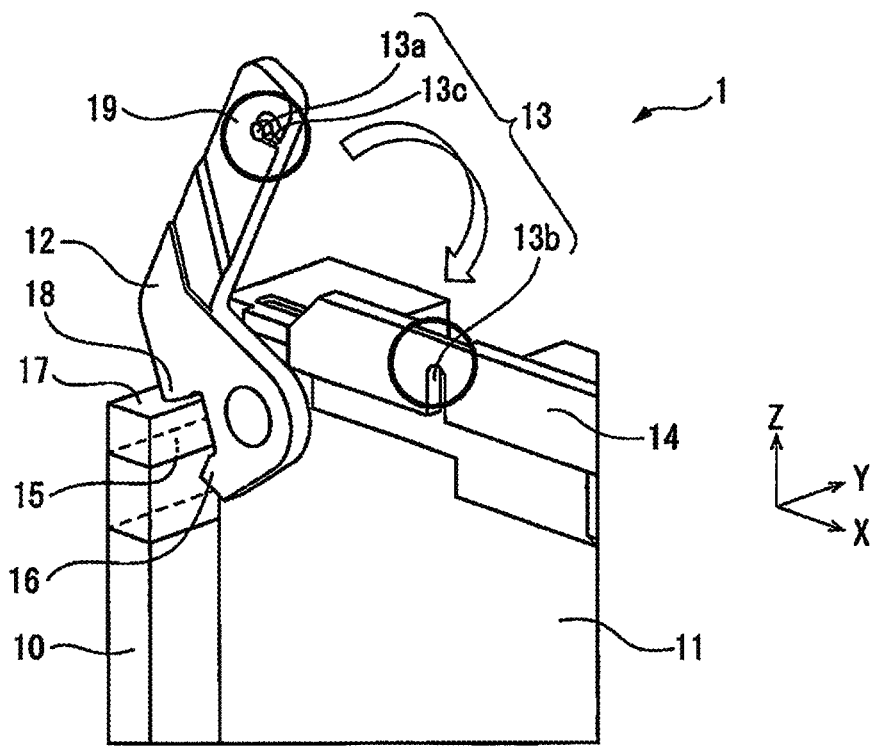
FIG. 1 is a perspective view illustrating a circuit board fall-out prevention structure according to one embodiment.

Embodiments of the present disclosure will be described in detail below with reference to the accompanying drawings. In the drawings, identical or similar constituent elements are given identical or similar reference signs. Additionally, the embodiments described below are not intended to limit the technical scope of the invention or the meaning of terms set forth in the claims.

FIG. 1 illustrates a circuit board fall-out prevention structure 1 according to the present embodiment. The circuit board fall-out prevention structure 1 includes a housing 10, a circuit board 11, an insertion and extraction lever 12, and a recess-protrusion 13. The circuit board 11 is fitted to the housing 10 in an insertable and extractable manner. An interface plate 14 may be attached to an external connector (not illustrated) side of the circuit board 11. The insertion and extraction lever 12 is supported with a shaft rotatably with respect to the circuit board 11, and is capable of being hooked on the housing 10 to facilitate an insertion and extraction operation of the circuit board 11. The insertion and extraction lever 12 includes an insertion hook piece 16 that is hooked on a groove portion 15 of the housing 10, an extraction hook piece 18 that is hooked on an end portion 17 of the housing 10, and an operation piece 19 used for the insertion and extraction operation of the circuit board 11.

The recess-protrusion 13 is capable of being hooked between the insertion and extraction lever 12 and the circuit board 11 in a direction Y different from an insertion and extraction direction Z of the circuit board 11. It should be noted that the direction Y illustrated in FIG. 1 is a direction perpendicular to the insertion and extraction direction Z, but is not limited thereto. The recess-protrusion 13 is formed on the insertion and extraction lever 12 and the interface plate 14, includes a protrusion 13a on the insertion and extraction lever 12, and a recess 13b on the interface plate 14. Note that in an embodiment in which the interface plate 14 is not provided, the recess-protrusion 13 may be formed on the insertion and extraction lever 12 and the circuit board 11, or the protrusion 13a and the recess 13b may be formed on members reverse to each other.

The recess-protrusion 13 may further include a sloped surface 13c that is continuous from the top surface of the protrusion 13a. As a result, the protrusion 13a and the recess 13b are made to naturally engage with each other simultaneously with pushing-in the operation piece 19. The sloped surface 13c illustrated in FIG. 1 is continuous with the protrusion 13a, but may also have a form continuous with the recess 13b.

Figure 2:
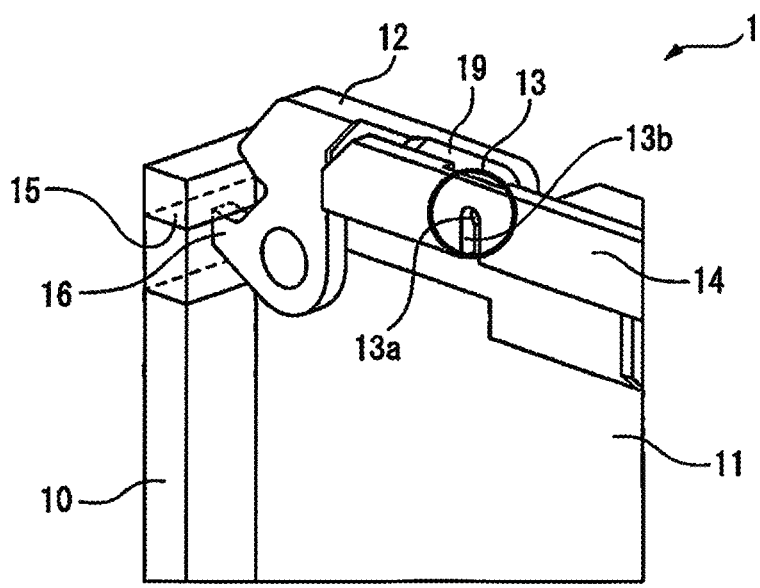
FIG. 2 is a perspective view illustrating a circuit board fall-out prevention structure according to one embodiment.
Figure 3:
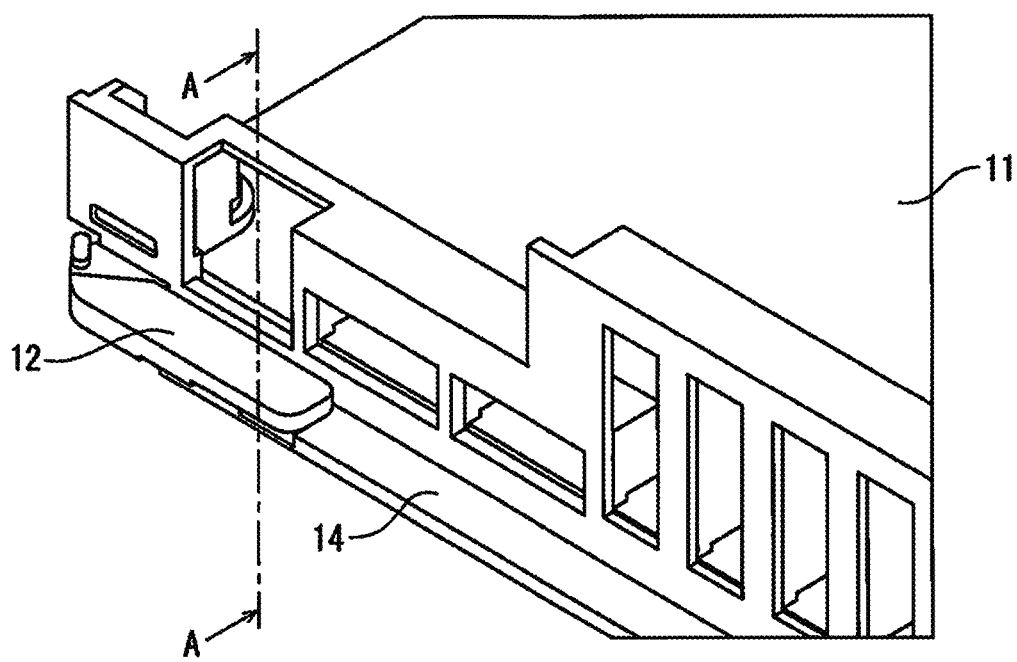
FIG. 3 is a rear surface side perspective view illustrating a circuit board fall-out prevention structure according to one embodiment.
Figure 4:
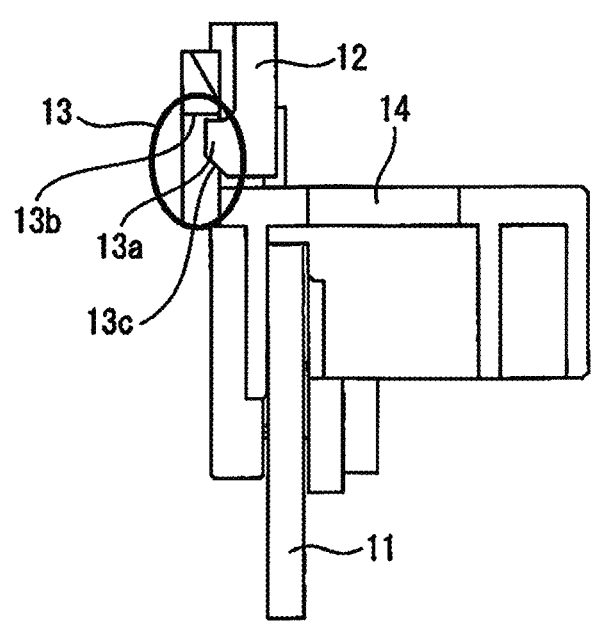
FIG. 4 is a cross-sectional view taken along a line A-A, illustrating a circuit board fall-out prevention structure according to one embodiment.

FIG. 2 to FIG. 4 each illustrate the circuit board fall-out prevention structure 1 in a locked state. When the circuit board 11 is inserted, the protrusion. 13a and the recess 13b are engaged by simply tilting the insertion and extraction lever 12, and the circuit board 11 is prevented from falling out. According to the circuit board fall-out prevention structure 1 as described above, it is possible to prevent the circuit board 11 from falling out in a simple operation same as the related one without increasing the number of parts. When the circuit board 11 is extracted, by flexing the insertion and extraction lever 12 in the direction Y and releasing the engagement between the protrusion 13a and the recess 13b, the lock is released. Therefore, it is desirable that the insertion and extraction lever 12 be formed from a flexible material such as a resin or the like.

Figure 5:
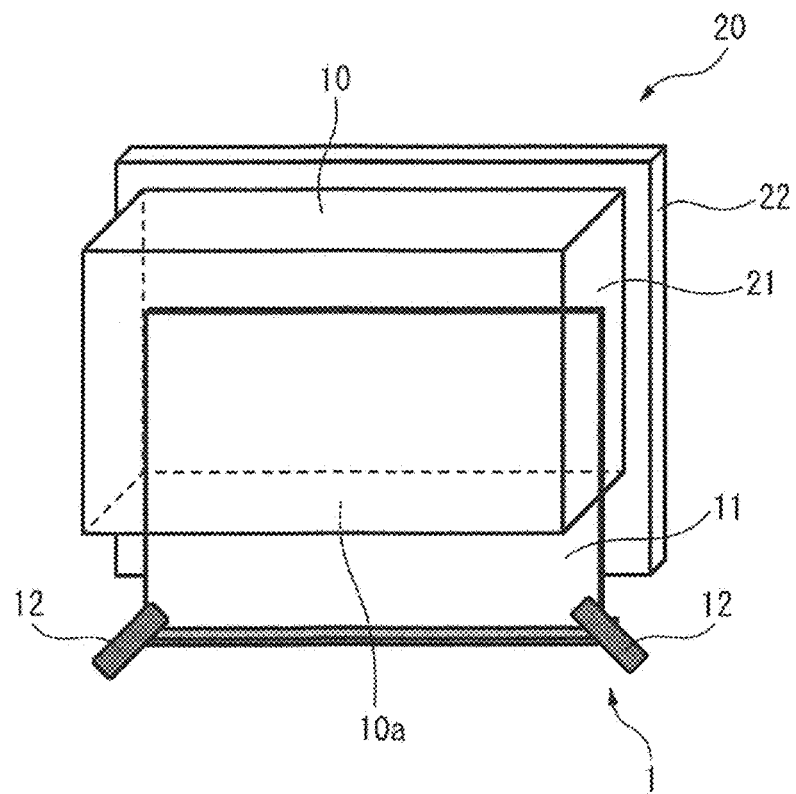
FIG. 5 is a perspective view illustrating a numerical control device to which a circuit board fall-out prevention structure is applied.

FIG. 5 illustrates a numerical control device 20 to which the circuit board fall-out prevention structure 1 is applied. The circuit board fall-out prevention structure 1 is effective when applied to a device used in a severe situation, for example, the numerical control device 20 that controls a machine tool, a robot, and the like. The numerical control device 20 includes a controller 21 through which vibration, shock, or the like is transmitted, one or more circuit boards 11 that are fitted to the housing 10 of the controller 21 in an insertable and extractable manner, and a display section 22 that displays various kinds of information. The housing 10 includes an insertion and extraction port 10a, and the circuit board 11 is fitted to the housing 10 via the insertion and extraction port 10a. The housing 10 is arranged so that the insertion and extraction port 10a faces downward in the vertical direction in a use state, and the circuit board 11 is arranged so that the insertion and extraction direction is the vertical direction in the use state. In this case, since the related insertion and extraction lever does not include a lock structure, the circuit board 11 is made into a state of easily coming off from the housing 10, but according to the circuit board fall-out prevention structure 1 of the present example, the circuit board 11 can be reliably prevented from falling off.

Figure 6:
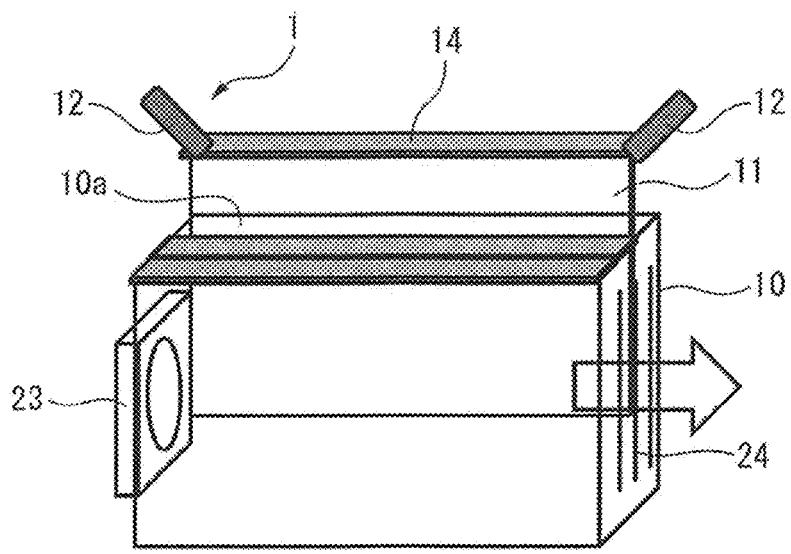
FIG. 6 is a perspective view illustrating an interface plate.
Figure 7A:
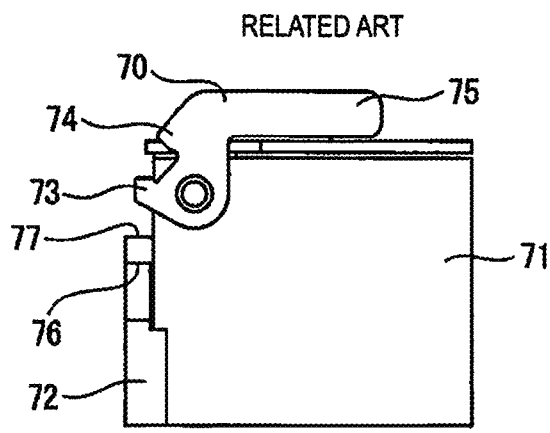
FIG. 7A is a side surface view illustrating an example of a related insertion and extraction lever.
Figure 7B:
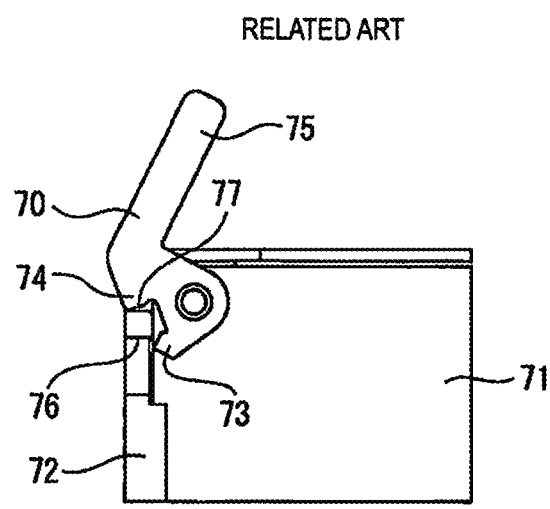
FIG. 7B is a side surface view illustrating an example of the related insertion and extraction lever.
Figure 7C:
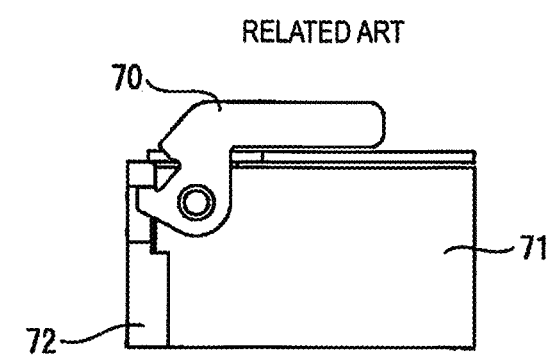
FIG. 7C is a side surface view illustrating an example of the related insertion and extraction lever.

FIG. 6 illustrates the interface plate 14. In a case that a cable (not illustrated) is connected to an external connector (not illustrated) of the circuit board 11, the cable is unintentionally pulled in some cases. In this case, since the related insertion and extraction lever does not include a lock structure, the circuit board 11 is made into a state of easily falling out from the housing 10, but according to the circuit board fall-out prevention structure 1 of the present example, the circuit board 11 can be reliably prevented from falling out. Note that the interface plate 14 also plays the role to close the insertion and extraction port 10a, and the air blown from a cooling fan 23 that cools the circuit board 11 is discharged to an exhaust port 24 of the housing 10 without leaking out from the insertion and extraction port 10a.

According to the present embodiment, it is possible to prevent the circuit board 11 from falling out in a simple operation without increasing the number of parts.

Although some embodiments have been described in this specification, the present invention is not limited to the above-described embodiments, and it is to be understood that various changes can be made without departing from the scope of the appended claims.

The invention claimed is:

1. A circuit board fall-out prevention structure, comprising:
    a housing;
    a circuit board fitted to the housing in an insertable and extractable manner;
    an interface plate attached to the circuit board;
    an insertion and extraction lever supported with a shaft rotatably with respect to the circuit board, the insertion and extraction lever configured to be hooked on the housing to facilitate an insertion and extraction operation of the circuit board;
    a recess provided in one of the insertion and extraction lever and the interface plate; and
    a protrusion provided on the other of the insertion and extraction lever and the interface plate, wherein
    after insertion of the circuit board in an insertion and extraction direction into the housing, the recess and the protrusion are hooked between the insertion and extraction lever and the interface plate in a direction different from the insertion and extraction direction of the circuit board,
    the housing includes an insertion and extraction port,
    the circuit board is fitted to the housing via the insertion and extraction port, and
    the interface plate is configured to close the insertion and extraction port after the insertion of the circuit board in the insertion and extraction direction into the housing, and an air blown from a cooling fan that cools the circuit board is discharged without leaking out from the insertion and extraction port.

2. The circuit board fall-out prevention structure of claim 1,
    wherein the circuit board is arranged with the insertion and extraction direction being a vertical direction, in a use state.

3. The circuit board fall-out prevention structure of claim 1, wherein the insertion and extraction lever is formed from a flexible material, and an engagement between the protrusion and the recess is released by flexing the insertion and extraction lever in the direction different from the insertion and extraction direction of the circuit board when the circuit board is extracted.

4. The circuit board fall-out prevention structure of claim 1, further comprising:
a sloped surface that is continuous from one of the protrusion and the recess, wherein the sloped surface facilitates an engagement between the protrusion and the recess.

5. A numerical control device, comprising:
a circuit board fall-out prevention structure, which comprises:
   a housing;
   a circuit board fitted to the housing in an insertable and extractable manner;
   an interface plate attached to the circuit board;
   an insertion and extraction lever supported with a shaft rotatably with respect to the circuit board, the insertion and extraction lever configured to be hooked on the housing to facilitate an insertion and extraction operation of the circuit board;
   a recess provided in one of the insertion and extraction lever and the interface plate; and
   a protrusion provided on the other of the insertion and extraction lever and the interface plate, wherein
   after insertion of the circuit board in an insertion and extraction direction into the housing, the recess and the protrusion are hooked between the insertion and extraction lever and the interface plate in a direction different from the insertion and extraction direction of the circuit board,
   the housing includes an insertion and extraction port,
   the circuit board is fitted to the housing via the insertion and extraction port, and
   the interface plate is configured to close the insertion and extraction port after the insertion of the circuit board in the insertion and extraction direction into the housing, and an air blown from a cooling fan that cools the circuit board is discharged without leaking out from the insertion and extraction port.

* * * * *